(12) United States Patent
Ghinovker et al.

(10) Patent No.: US 7,684,038 B1
(45) Date of Patent: Mar. 23, 2010

(54) OVERLAY METROLOGY TARGET

(75) Inventors: Mark Ghinovker, Ilit (IL); Vladimir Levinski, Ilit (IL)

(73) Assignee: KLA-Tencor Corporation, Milpitas, CA (US)

( * ) Notice: Subject to any disclaimer, the term of this patent is extended or adjusted under 35 U.S.C. 154(b) by 3 days.

(21) Appl. No.: 12/062,874

(22) Filed: Apr. 4, 2008

(51) Int. Cl.
G01B 11/00 (2006.01)
G06K 9/00 (2006.01)

(52) U.S. Cl. .................. 356/399; 356/401; 382/151
(58) Field of Classification Search .............. None
See application file for complete search history.

(56) References Cited

U.S. PATENT DOCUMENTS

| | | | |
|---|---|---|---|
| 5,640,466 A * | 6/1997 | Huttenlocher et al. ....... 382/177 |
| 5,877,861 A * | 3/1999 | Ausschnitt et al. .......... 356/401 |
| 6,824,958 B2 * | 11/2004 | Hayano et al. .............. 430/311 |
| 6,912,438 B2 * | 6/2005 | Choo et al. ................. 700/121 |
| 6,975,974 B2 * | 12/2005 | Chien et al. .................... 703/2 |
| 7,483,156 B2 * | 1/2009 | Cho .......................... 356/635 |
| 2005/0099628 A1 * | 5/2005 | Kokumai .................... 356/401 |
| 2006/0110069 A1 * | 5/2006 | Tong et al. .................. 382/294 |

* cited by examiner

*Primary Examiner*—Tarifur Chowdhury
*Assistant Examiner*—Gordon J Stock, Jr.
(74) *Attorney, Agent, or Firm*—Luedeka, Neely & Graham, P.C.

(57) ABSTRACT

In one embodiment, a metrology target for determining a relative shift between two or more successive layers of a substrate may comprise; an first structure on a first layer of a substrate and an second structure on a successive layer to the first layer of the substrate arranged to determine relative shifts in alignment in both the x and y directions of the substrate by analyzing the first structure and second structure overlay.

2 Claims, 6 Drawing Sheets

OVERLAY METROLOGY TARGET

BACKGROUND

This invention relates generally to overlay measurement techniques, which are used in semiconductor manufacturing processes. More specifically, the present invention relates to techniques for measuring alignment error between different layers or different patterns on the same layer of a semiconductor wafer stack.

The measurement of overlay error between successive patterned layers on a wafer is one of the most critical process control techniques used in the manufacturing of integrated circuits and devices. Overlay accuracy generally pertains to the determination of how accurately a first patterned layer aligns with respect to a second patterned layer disposed above or below it and to the determination of how accurately a first pattern aligns with respect to a second pattern disposed on the same layer.

Although this conventional overlay design has worked well, there are continuing efforts to provide improved techniques for determining or predicting overlay in device structures.

DETAILED DESCRIPTION

Reference will now be made in detail to specific embodiments of the invention. Examples of this embodiment are illustrated in the accompanying drawings. While the invention will be described in conjunction with these specific embodiments, it will be understood that it is not intended to limit the invention to these embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

In general, the present invention provides semiconductor targets for determining an overlay error between two process layers or a shift between two sets of structures on the same layer, where the target structures are designed with a known relationship between their symmetry characteristics. Although the following target examples are shown to have structures on two layers for measuring overlay, it is readily apparent that each target may include two sets of structures on the same layer for determining a shift error between such set of structures.

In the context of this invention the usage of terms such as, but not limited to parallel, midpoint, perpendicular, degree descriptions, or the like, are not met to limit the invention. By way of example and not limitation, usage of the X-axis is not meant to limit the invention, but rather is intended only to describe an approximate first direction. By way of example and not limitation, usage of the Y-axis is not meant to limit the invention, but rather is intended only to describe an approximate second direction. One of ordinary skill in the art would interpret these terms to extend to reasonable variations within tolerances as the industry dictates.

In the first embodiments described in FIG. 1, the targets comprise two structures: a first structure and second structure. In some embodiments, the first structure may be printed on a first layer, and the second structure may be printed on a second successive layer.

Figure 1A:
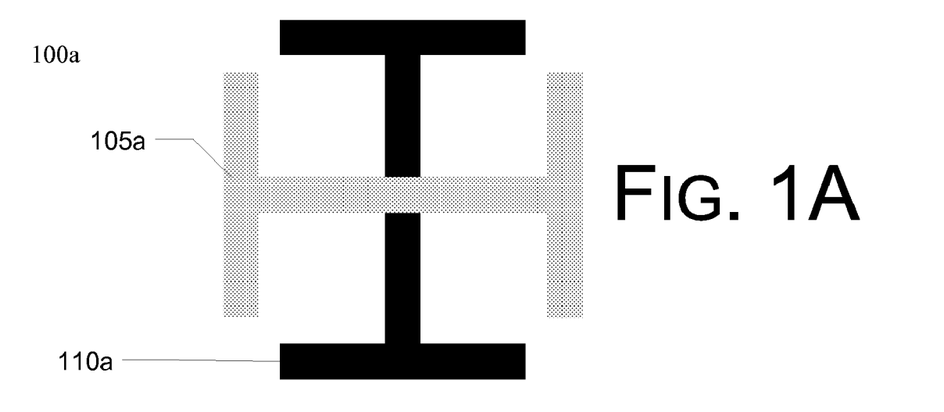
FIG. 1A is a schematic illustration of overlay targets for measuring overlay error between successive substrate layers, according to embodiments.

One embodiment of the current invention is presented in FIG. 1A (100a). In such embodiments, a first structure (105a) may comprise two line segments separated by a known distance. In such embodiments, a third line segment may connect said two line segments starting from approximately the midpoint of each of said two line segments resulting in a third line connecting the two line segments. In some embodiments, the second structure (110a) may comprise the same structure as the first structure (105a) but rotated 90 degrees.

Figure 1B:
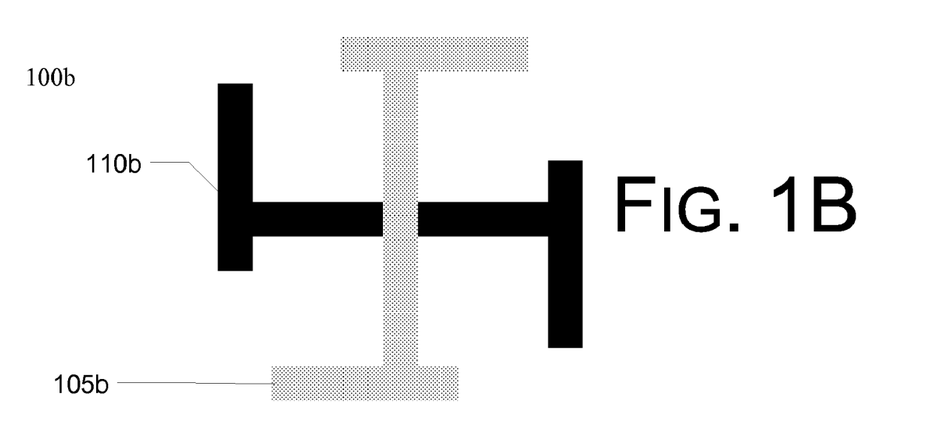
FIG. 1B is a schematic illustration of overlay targets for measuring overlay error between successive substrate layers, according to embodiments.

One embodiment of the current invention is presented in FIG. 1B (100b). In such embodiments, a first structure (105b) may comprise two line segments separated by a known distance. In such embodiments, a third line segment may connect the two line segments starting from the known points of each of the two line segments and resulting in a third line connecting to the two line segments. The known location may be a known distance closer to a first end of the line segments than to the line segment's second end. The second structure (110b) may comprise the same structure as the first structure (105b) but rotated 90 degrees.

Figure 1C:
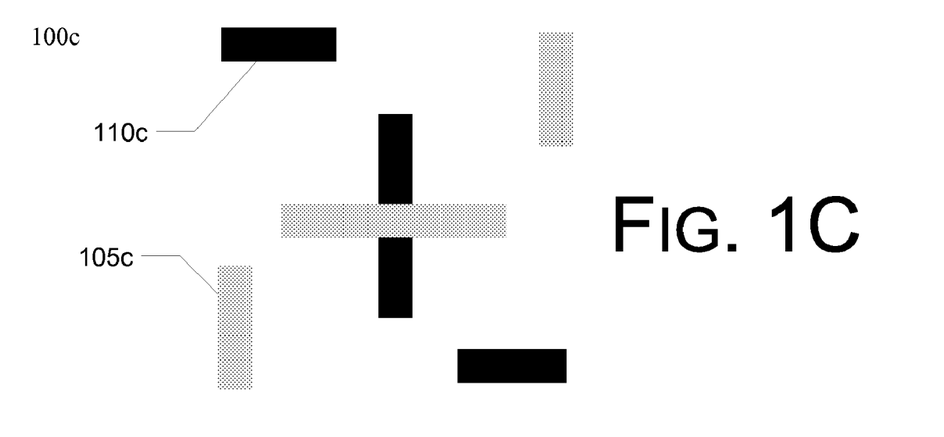
FIG. 1C is a schematic illustration of overlay targets for measuring overlay error between successive substrate layers, according to embodiments.

One embodiment of the current invention is presented in FIG. 1C (100c). In such embodiments, a first structure (105c) may comprise two line segments separated by a known distance. In such embodiments, a third line segment may be present a known distance removed from the two line segments intersecting with the structures center of symmetry and resulting in the third line between to the two line segments. The second structure (110c) may comprise the same structure as the first structure (105c) but rotated 90 degrees.

Figure 1D:
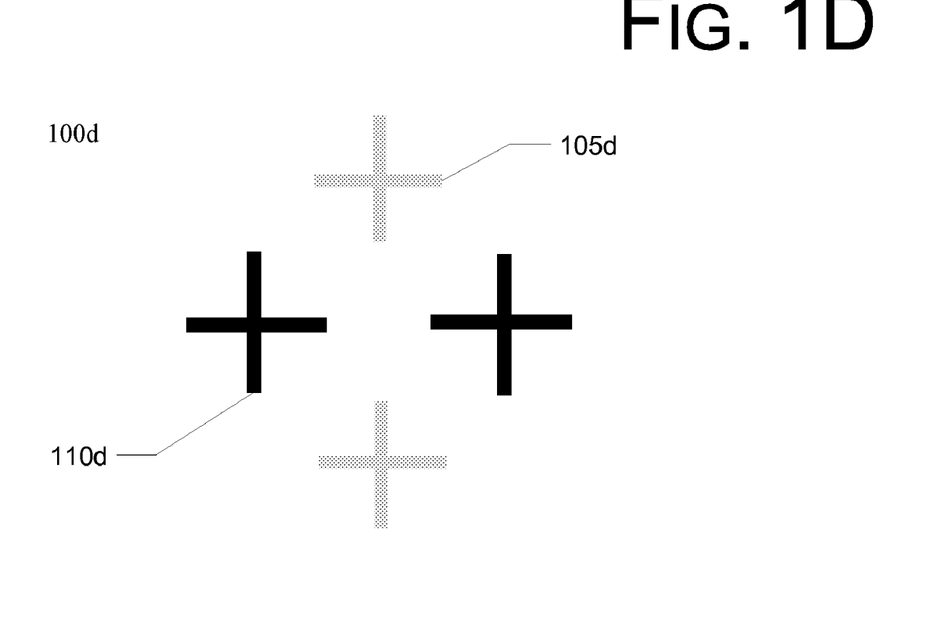
FIG. 1D is a schematic illustration of overlay targets for measuring overlay error between successive substrate layers, according to embodiments.

An embodiment of the current invention is presented in FIG. 1D (100d). When only a few layers need to be measured no acquisition target may be required. Referring to FIG. 1D (100d), the target itself may be used for acquisition. In such embodiments, the first structure (105d) may comprise two substructures on a first layer each defined by two line segments crossing at their midpoints with each located an known distances from the center of symmetry, and the second structure (110d) may comprise two substructures on a second layer each defined by two line segments crossing at their midpoints with each located an equal known distances from the center of symmetry.

In operation, there is a need to avoid cross ends approaching each other. By way of example and not limitation, there may be at least three options to better separation between layers to avoid cross-talk, such as; Keeping as is a pitch of 6 microns and a cross size of 4 microns and avoiding cross ends during measurement; shrinking crosses to a pitch of 6 microns and a cross size of 2 microns, and the whole crosses may be used during measurements; or, increasing to a pitch of 8 microns, and a cross size to 4 microns and using the whole crosses during measurement.

In some embodiments, the first and second structures may be invariant to 180 degree rotation thus allowing separation of tool induced shift (TIS) from real overlay measurement. In some embodiments, by design the centers of symmetry of first and second structures coincide. In some embodiments, misalignment in overlay between the first and the second layers may cause these centers of symmetry to split. In operation, measuring this split between the centers of symmetry of first and second features is considered the overlay measurement.

In some embodiments, these targets rotated by 90 degrees are also legitimate targets. In such embodiments, the targets lack 90 degree rotational symmetry and therefore informational content of targets is different for different directions, such as but not limited to X and Y for each of the successive layers. The overlay metrology targets described have particular advantages in terms of information distribution. By way of example and not limitation, these targets effectively utilize the real estate designated for overlay metrology, allowing minimal separation between information from the first and the second layers. Furthermore, these targets may be shrunk to target sizes of 5 microns and even below. By way of example and not limitation, the information cross-talk between the two layers may be avoided due to the following: firstly, in the most areas of the target (apart of the very target center) the layers are spatially separated and thus every segment of image extracted from those areas delivers information about one of the layers only, and secondly in the very center of the target and in its vicinity information is mixed between the two layers, however, there is directional separation of the information. Therefore, all the information about the first direction coming from the center of the target corresponds to one layer only (the layer of second feature), while all the information about the second direction coming from the center of the target corresponds to the other layer only (the layer of first feature). In some embodiments, a first direction may be along the X-axis and a second direction may be along the Y-axis.

In some embodiments, an advantage of the target designs as compared to BiB/AIM (box-in-box/advanced imaging metrology) targets is that the targets may minimize the effect of optical cross-talk on the accuracy of overlay measurement. In such embodiments, despite the small targets size up to 5 μm all bars apart from the central ones may be separated enough to eliminate optical cross-talk effects. Furthermore, the central bars may be perpendicular to each other which may allow measuring their center of symmetry positions independently of overlay shifts in both directions.

Figure 2:
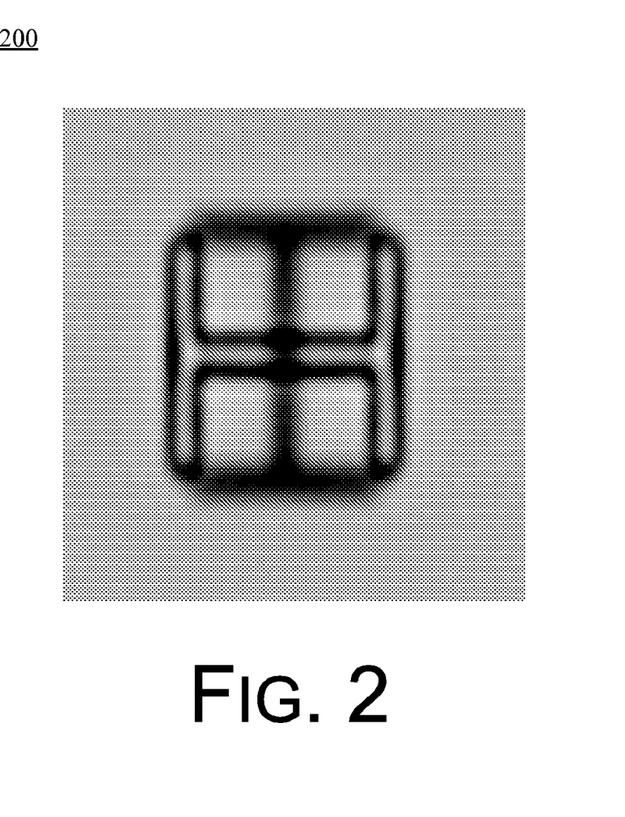
FIG. 2 is a schematic illustration of a 5 micron size target printed on a test wafer as view by an overlay tool, according to embodiments.

FIG. 2 presents a 5 micron size target structure 200 printed on test wafers as viewed by an overlay tool.

Figure 3A:
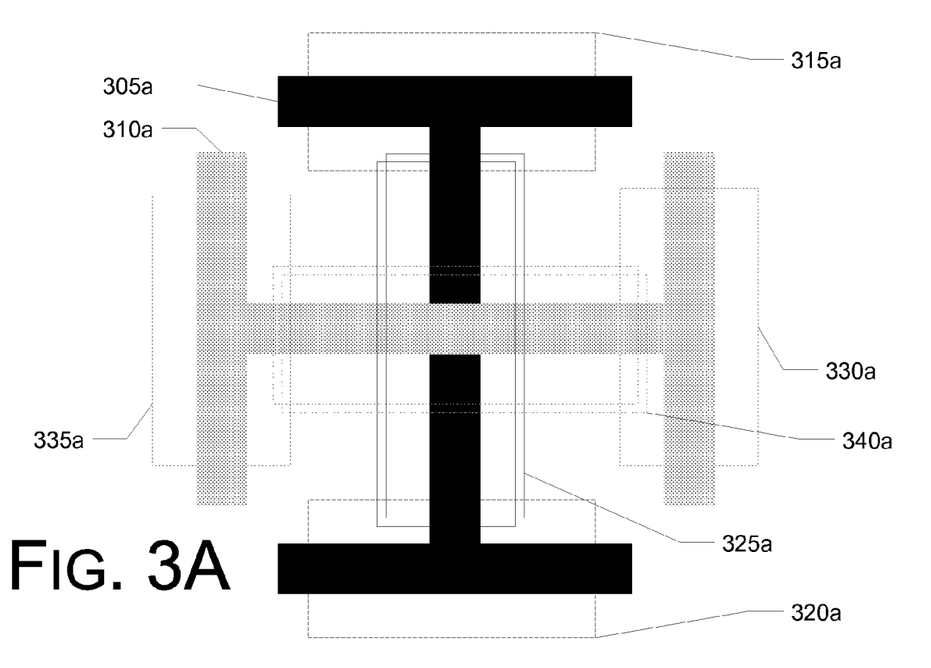
FIG. 3A is a view of overlay targets for measuring overlay error between successive substrate layers with Regions of Interest (ROIs) noted, according to embodiments.
Figure 3B:
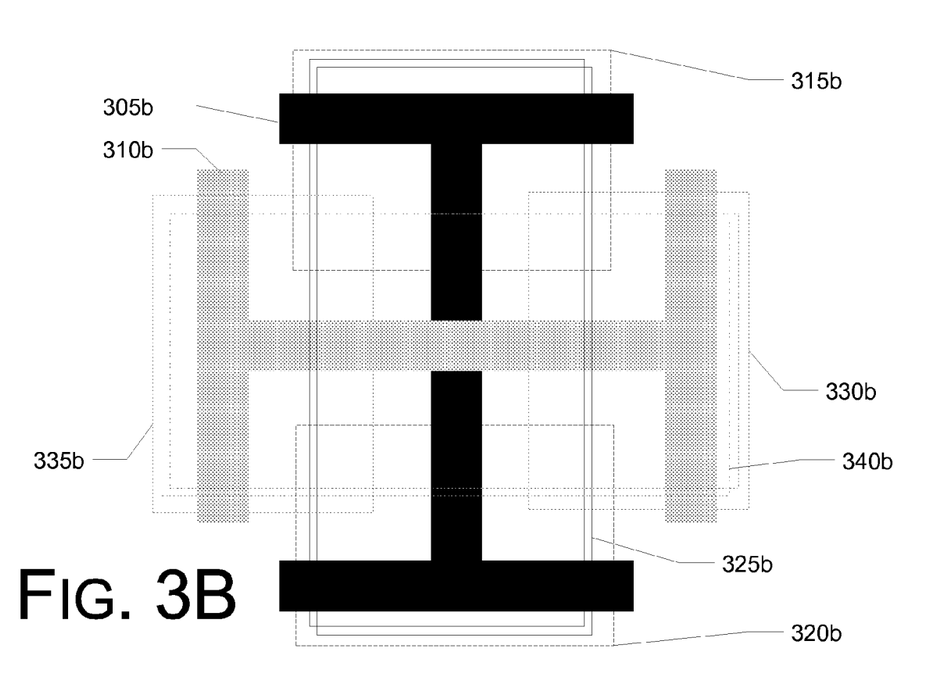
FIG. 3B is a schematic illustration of overlay targets for measuring overlay error between successive substrate layers with Regions of Interest (ROIs) noted, according to embodiments.

FIG. 3 illustrates an embodiment with ROIs shown as they may be used in aiding with alignment and analysis of targets.

Referring to FIG. 3, only the first embodiment of a metrology target is shown, but this is not meant to limit the methods described hereafter to that specific embodiment. On the contrary, the methods described hereafter may be used for all embodiments of this invention. In some embodiments, a method of measurement of a target might be substantially similar to the method of measurement of a standard Box in Box (BiB) target. In some embodiments, the center of symmetry of the first structure (310a) may be found by correlation of horizontal projections of the ROIs (330a and 335a) to find center of symmetry in a first direction. In some embodiments, the center of symmetry of the first structure (310a) may be found by correlating of vertical projections of the ROIs (340a) to find center of symmetry in second direction. In some embodiments, these ROIs (340a) may or may not be coincide. In some embodiments, a first direction may be along the X-axis and a second direction may be along the Y-axis.

In some embodiments, the center of symmetry of the second structure (305a) may be found by correlation of vertical projections of the ROIs (315a and 320a) to find center of symmetry in a second direction. In some embodiments, the center of symmetry of the second structure (305a) may be found by correlating of horizontal projections of the ROIs (325a) to find center of symmetry in a first direction. In some embodiments, these ROIs (325a) may or may not be coincide. In some embodiments, a first direction may be along the X-axis and a second direction may be along the Y-axis.

The COS for each set of structures 310a and 305a from the first and second layers, respectively, may be determined using any suitable technique. By way of example and not limitation, an edge technique may be utilized to determine COS for the structures in each layer. In the illustrated embodiment presented in FIG. 3, the outside edges of each ROI of each layer may be used to determine the COS for each layer. For the structures 305a and 310a, the outside edges of each ROI (315a, 320a and 330a, 335a respectively) may be determined and then the edges are then used to find a center position between the outside edges of each set of structures (e.g., between structures 305a and structures 310a).

Alternatively, FIG. 3B illustrates ROIs for a 2D-correlation algorithm that may be used to find centers of symmetry (COS). By way of example and not limitation, in a correlation algorithm, for the structure each ROI set of each layer and their 180 degree rotational counterpart (315b, 320b and 330b, 335b) and (325b and 340b) may be placed based on an initial COS. Then a COS is continually moved for each layer until the best correlation is found between the rotated image and original images of each layer. Finally, after the best correlation is found, the COS is found between the outside edges of each set of structures (e.g., between structures 305b and structures 310b).

The target rules preferably include a requirement that the target be placed in a layer which is measurable or inspectable by a particular type of tool. For example, the target may have to be on a top layer or be covered with only optically transparent layers so that the target may be inspected by an optical tool. In the prior art, overlay metrology marks have been proposed which are designed to minimize the real estate requirements for scribeline or in-die metrology. The target generally may comprise two features, one in each layer, which may be positioned side by side or one inside the other. If the metrology target size is to shrink however, this generally may require that the two features also shrink. Additionally, generally targets do not overlap so as the signals from both layers can be unambiguously differentiated or to ensure that some signal is present from both layers in the captured image. In other applications, the target may be required to be underneath an opaque layer so that the opaque layer's conformance to the underlying target may be inspected and/or measured. Additionally, each inspection, review, or metrology tool typically has a size constraint as to the measured or inspected structure. That is, structures below a particular size cannot be seen. Therefore, the targets must be sized so that they can be measured or inspected by the relevant tool.

The targets of the present invention described herein may be placed in any suitable space on the wafer. By way of example and not limitation, the targets may be placed in the scribe line or within the dies themselves. When targets are placed in a die, the die layout may also be analyzed to determine whether particular portions or areas have a characteristic which negatively or positively affects metrology or inspection results, as compared with other areas of the die layout. For example, particular layout characteristics may result in more reliable or accurate metrology or inspection results. By way of example and not limitation, targets may be placed in areas which have characteristics that positively affect the metrology or inspection. In an example of such a feature characteristic, a chemical mechanical polishing (CMP) procedure is typically tuned to achieve superior accuracy with a particular feature density range. Thus, targets, such as overlay targets, may be placed in layout regions which are within the particular feature density range for an optimal CMP process.

The circuit designer may be aware of feature locations in the die layout which are most susceptible to error or defects. The designer may communicate the position of such features to the target placement software or layout engineer so that targets may be placed proximate to such problem features. This placement technique would likely result in a higher incidence of defect capture and more reliable resulting products.

In operation, the described overlay metrology targets may have particular advantages in terms of manufacturability. By way of example and not limitation, modern processes forbid featureless areas below some minimal value. Each one of the two layers of the target utilizes both peripheral and central areas of the real estate allocated for the overlay mark and therefore featureless areas on both two layers are minimized. Neither BiB, nor AIM, nor some other target designs (like cross target) do not comply with this real estate minimization. Furthermore, simple rules of HI target design allow optimization of the target for best contrast by means of optimizing line width, line lengths, OPC features, segmentation or the like.

Figure 4:
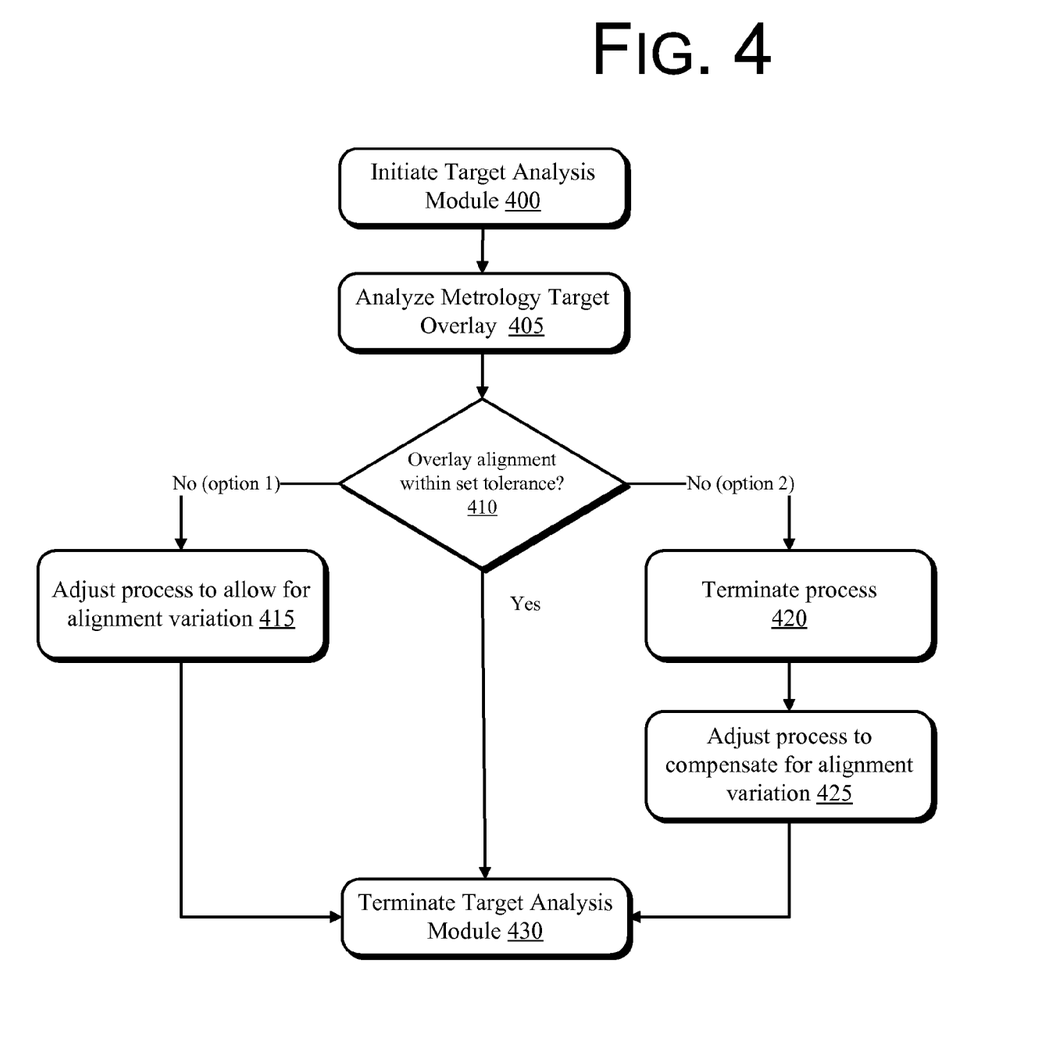
FIG. 4 is a flowchart illustrating a procedure for inspecting targets, according to embodiments.

After a die and targets are fabricated; the targets may be inspected, reviewed, or measured in any suitable manner. FIG. 4 is a flowchart illustrating a procedure for inspecting targets fabricated from a layout pattern generated in accordance with techniques of the present invention. At operation 400 a target analysis module is initiated. At operation 405 the module allows for analysis of target overlays between successive substrate layers. In some embodiments, each target is inspected or measured to determine whether a process is out of alignment. It is then determined whether a process is out of specification in operation 410. If a process is not out of alignment, the inspection, review, or measurement procedure ends at operation 430.

If a process is out of alignment beyond an allowable tolerance or threshold, a number of techniques may be implemented to alleviate the problem. In a first technique, a subsequent process may be adjusted to compensate for the process which is out of alignment in operation 415. For example, if it is determined that the photoresist pattern is misaligned in any portion, the photoresist may then be stripped and reapplied in a corrected pattern to eliminate the misalignment. In a second technique, processing of the die may be terminated in operation 420. The die may then be discarded and the process which is out of specification may then be adjusted for subsequent die(s) in operation 425.

Figure 5:
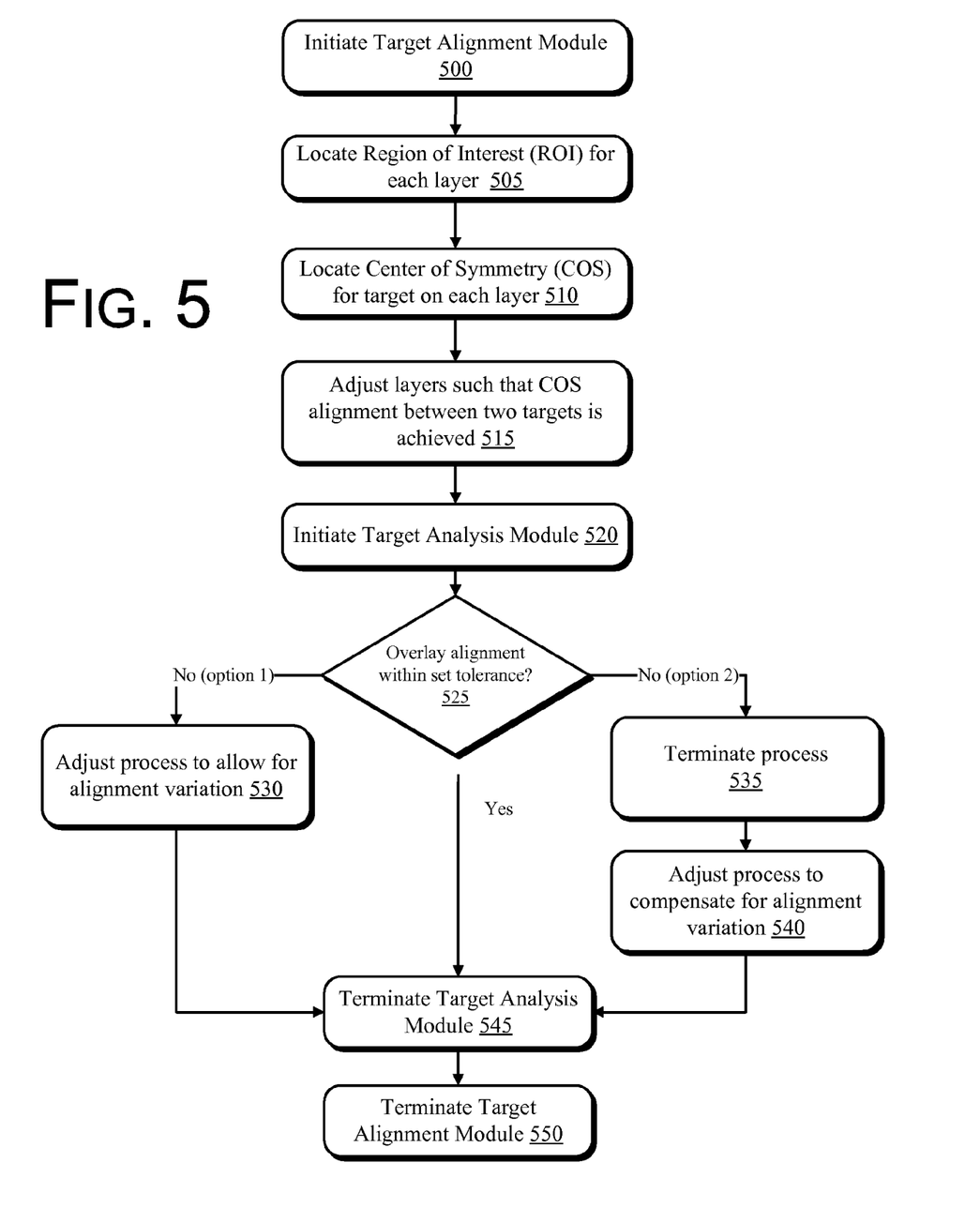
FIG. 5 is a flowchart illustrating a procedure for inspecting targets alignment, according to embodiments.

One may determine whether the targets are within tolerances for alignment in any suitable manner. FIG. 5 is a flow chart illustrating a method for determining whether a target is out of alignment beyond a known tolerance in accordance with a specific implementation of the present invention. Although this procedure is described with respect to a target having structures with a 180 degree rotational COS, this procedure may be easily modified for other structures. This procedure may also be applied to determining an alignment error between two sets of structures on the same layer, rather than an overlay error on two different layers as illustrated.

In the illustrated example of FIG. 5, a target alignment module is initiated at operation 500. The center of either H or I target structures are initially moved to the center of the field of view of the inspection tool in operation and the region of interests (ROI's) of each layer are then determined in operation 505. The target structures of FIG. 1 will be used to illustrate the procedure of FIG. 5. In some embodiments, locating a center of symmetry as in operation 510 may comprise; locating a target within a substrate layer, locating two regions of interest (ROIs) encompassing the two line segments of the structure in a first direction, correlating the horizontal projections of the ROIs encompassing the two lines of the structure in a first direction to find the center of symmetry in the first direction, locating at least one ROI encompassing the middle line segment of the structure in a second direction, and correlating the vertical projections of the ROI encompassing the middle line segment of the structure in a second direction to find the center of symmetry in the second direction. In some embodiments, locating a center of symmetry may comprise; locating a second structure target within a substrate layer, locating two regions of interest (ROIs) encompassing the two line segments of the second structure in a second direction, correlating the vertical projections of the ROIs encompassing the two lines of the second structure in a second direction to find the center of symmetry in the second direction, locating at least one ROI encompassing the middle line segment of the second structure in a first direction, and correlating the horizontal projections of the ROI encompassing the middle line segment of the second structure in a first direction to find the center of symmetry in the first direction. The layers are adjusted such that COS alignment between two targets is achieved, as given in operation 515, and then the target analysis module is initiated, as given in operation 520. It is then determined whether a process is out of specification in operation 525. If a process is not out of alignment, the inspection, review, or measurement procedure ends at operation 535.

If a process is out of alignment beyond an allowable tolerance or threshold, a number of techniques may be implemented to alleviate the problem. In a first technique, a subsequent process may be adjusted to compensate for the process which is out of alignment in operation 530. For example, if it is determined that the photoresist pattern is misaligned in any portion, the photoresist may then be stripped and reapplied in a corrected pattern to eliminate the misalignment. In a second technique, processing of the die may be terminated in operation 535. The die may then be discarded and the process which is out of specification may then be adjusted for subsequent die(s) in operation 540. The target analysis module is terminated as given in operation 545, and then the procedure for determining whether the target is out of alignment before a known tolerance then ends at operation 550.

Figure 6:
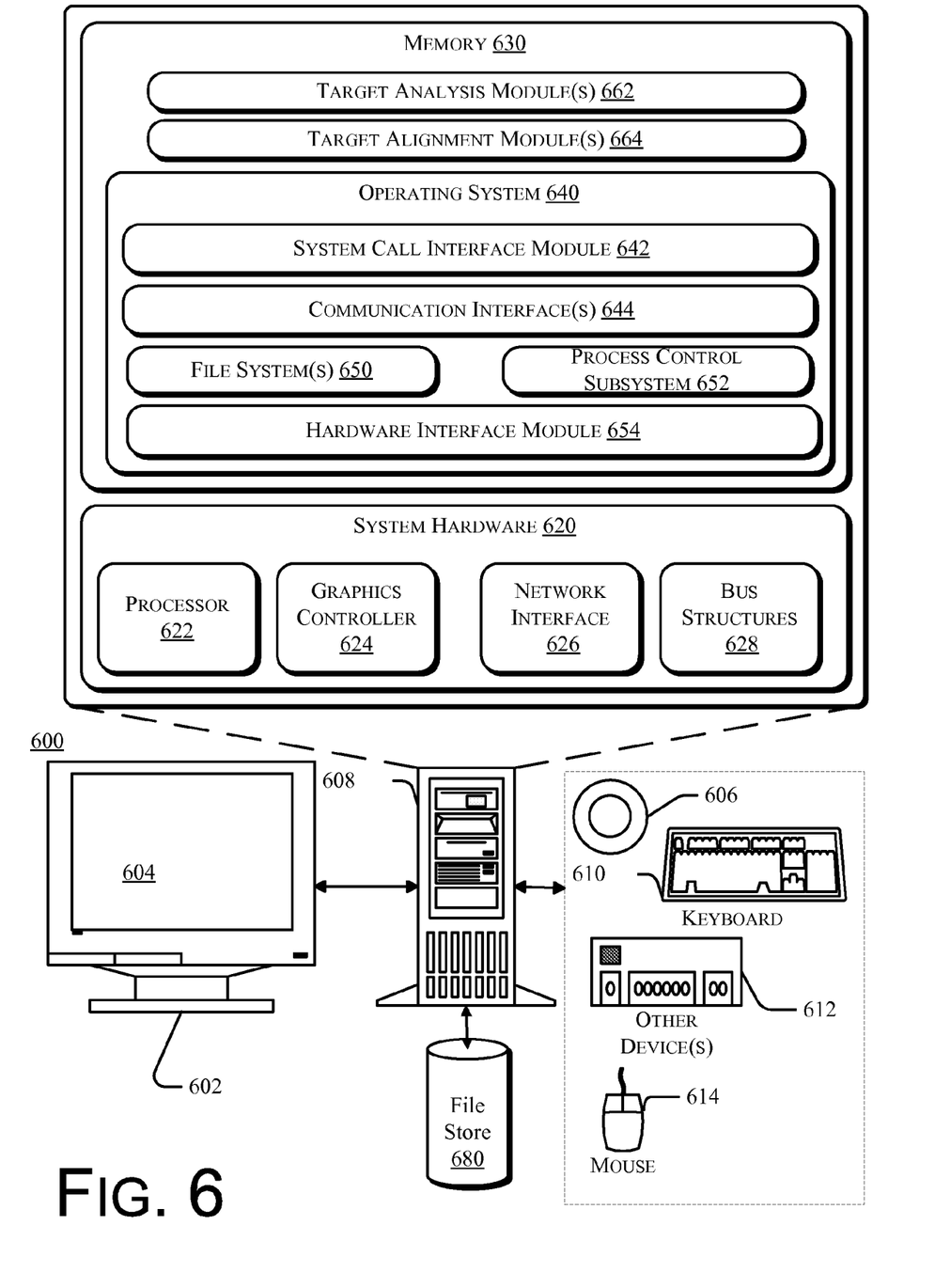
FIG. 6 is a schematic illustration of a computing system which may implement a procedure for inspecting target overlay alignment, according to embodiments.

FIG. 6 is a schematic illustration of one embodiment of a computing system which may be used to implement the metrology targets of FIGS. 1A, 1B, and 1C and the methods described in FIGS. 4 and 5. The computer system 600 includes a computer 608 and one or more accompanying input/output devices 606 including a display 602 having a screen 604, a keyboard 610, other I/O device(s) 612, and a mouse 614. The other device(s) 612 can include a touch screen, a voice-activated input device, a track ball, and any other device that allows the system 600 to receive input from a developer and/or a user. The computer 608 includes system hardware 620, such as a processor 622, graphics controller 624, network interface 626, and bus structures 628, and random access memory and/or read-only memory 630. A file store 680 is communicatively connected to computer 608. File store 680 may be internal such as, e.g., one or more hard drives, or external such as, e.g., one or more external hard drives, network attached storage, or a separate storage network.

Memory 630 includes an operating system 640 for managing operations of computer 608. In one embodiment, operating system 640 includes a hardware interface module 654 that provides an interface to system hardware 620. In addition, operating system 640 includes one or more file systems 650 that manage files used in the operation of computer 608 and a process control subsystem 652 that manages processes executing on computer 608. Operating system 640 further includes a system call interface module 642 that provides an interface between the operating system 640 and one or more application modules 662 and a communication interface 644.

In operation, one or more application modules and/or libraries executing on computer 608 make calls to the system call interface module 642 to execute one or more commands on the computer's processor. The system call interface module 642 invokes the services of the file system(s) 650 to manage the files required by the command(s) and the process control subsystem 652 to manage the process required by the command(s). The file system(s) 650 and the process control subsystem 652, in turn, invoke the services of the hardware interface module 654 to interface with the system hardware 620.

The particular embodiment of operating system 640 is not critical to the subject matter described herein. Operating system 640 may be embodied as a UNIX operating system or any derivative thereof (e.g., Linux, Solaris, etc.) or as a Windows® brand operating system.

In some embodiments, computer system 600 includes one or more modules to implement hybrid database query caching. In the embodiment depicted in FIG. 6, computer system 600 includes a target analysis module 662 which may implement the method described with reference to FIG. 4. In the embodiment depicted in FIG. 6, computer system 600 includes a target alignment module 664 which may implement the method described with reference to FIG. 5.

Reference in the specification to "one embodiment" or "an embodiment" means that a particular feature, structure, or characteristic described in connection with the embodiment is included in at least an implementation. The appearances of the phrase "in one embodiment" in various places in the specification may or may not be all referring to the same embodiment.

The techniques of the present invention may be implemented in any suitable combination of software and/or hardware system. Regardless of the system's configuration, it may employ one or more memories or memory modules configured to store data, program instructions for the general-purpose inspection operations and/or the inventive techniques described herein. The program instructions may control the operation of an operating system and/or one or more applications, for example. The memory or memories may also be configured to store layout patterns, layout constraint rules and target rules.

Because such information and program instructions may be employed to implement the systems/methods described herein, the present invention relates to machine readable media that include program instructions, state information, etc. for performing various operations described herein. Examples of machine-readable media include, but are not limited to, magnetic media such as hard disks, floppy disks, and magnetic tape; optical media such as CD-ROM disks; magneto-optical media such as floptical disks; and hardware devices that are specially configured to store and perform program instructions, such as read-only memory devices (ROM) and random access memory (RAM). The invention may also be embodied in a carrier wave traveling over an appropriate medium such as airwaves, optical lines, electric lines, etc. Examples of program instructions include both machine code, such as produced by a compiler, and files containing higher level code that may be executed by the computer using an interpreter.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

What is claimed is:

1. A method for aligning metrology targets comprising:
   locating a region of interest in substrate layers within which targets may be found;
   locating a center of symmetry for at least two targets in at least two successive layers; wherein locating the center of symmetry comprises:
   locating an H-structure target within a substrate layer;
   locating two regions of interest encompassing two line segments of the H-structure in a first direction;
   correlating horizontal projections of the regions of interest encompassing the two line segments of the H-structure in the first direction to find the center of symmetry in an X direction;
   locating one region of interest encompassing a middle line segment of the H-structure in a second direction; and
   correlating a vertical projection of the region of interest encompassing the middle line segment of the H-structure in the second direction to find the center of symmetry in a Y direction, and
   adjusting at least one of the substrate's successive layers as to align the center of symmetry for at least two targets in at least two successive layers.

2. A method for aligning metrology targets comprising:
   locating a region of interest in substrate layers within which targets may be found;
   locating a center of symmetry for at least two targets in at least two successive layers; wherein locating the center of symmetry comprises:
   locating an I-structure target within a substrate layer;
   locating one region of interest encompassing a middle line segment of the I-structure in a first direction;

correlating a horizontal projection of the region of interest encompassing the middle line segment of the I-structure in a first direction to find the center of symmetry in an X direction;

locating two regions of interest encompassing two line segments of the I-structure in a second direction; and correlating vertical projections of the regions of interest encompassing the two line segments of the I-structure in the second direction to find the center of symmetry in a Y direction, and adjusting at least one of the substrate's successive layers as to alien the center of symmetry for at least two targets in at least two successive layers.

* * * * *